(12) United States Patent
Lung

(10) Patent No.: US 7,534,713 B2
(45) Date of Patent: May 19, 2009

(54) HIGH DENSITY CHALCOGENIDE MEMORY CELLS

(75) Inventor: Hsiang Lan Lung, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 146 days.

(21) Appl. No.: 11/433,539

(22) Filed: May 11, 2006

(65) Prior Publication Data

US 2007/0264812 A1  Nov. 15, 2007
US 2009/0053886 A9  Feb. 26, 2009

Related U.S. Application Data

(62) Division of application No. 10/456,818, filed on Jun. 6, 2003, now Pat. No. 7,067,865.

(51) Int. Cl.
*H01L 47/00* (2006.01)

(52) U.S. Cl. .............. 438/600; 438/102; 438/103; 438/601; 257/E45.003; 257/E45.002

(58) Field of Classification Search .............. 257/2, 257/3, E45.002–E45.003, 4, 5; 438/102, 438/103, 600, 601
See application file for complete search history.

(56) References Cited

U.S. PATENT DOCUMENTS

| | | | |
|---|---|---|---|
| 5,687,112 A | 11/1997 | Ovihinsky | |
| 5,789,277 A | 8/1998 | Zahorik et al. | |
| 5,837,564 A | 11/1998 | Sandhu et al. | |
| 5,869,843 A | 2/1999 | Harshfield | |
| 5,879,955 A | 3/1999 | Gonzalet et al. | |
| 6,031,287 A | 2/2000 | Harshfield et al. | |
| 6,104,038 A | 8/2000 | Gonzalez et al. | |
| 6,111,264 A | 8/2000 | Wolstenholme et al. | |
| 6,147,395 A | 11/2000 | Gilgen | |
| 6,150,253 A | 11/2000 | Doan et al. | |
| 6,806,528 B2 | 10/2004 | Lee et al. | |
| 6,830,952 B2 | 12/2004 | Lung | |
| 6,864,503 B2 | 3/2005 | Lung | |
| 6,909,107 B2 | 6/2005 | Rodgers et al. | |
| 7,115,927 B2 * | 10/2006 | Hideki et al. | 257/296 |
| 2003/0001229 A1 * | 1/2003 | Moore et al. | 257/528 |
| 2004/0248339 A1 * | 12/2004 | Lung | 438/102 |
| 2005/0030832 A1 * | 2/2005 | Lee et al. | 365/232 |
| 2005/0062074 A1 | 3/2005 | Lung | |
| 2005/0093022 A1 | 5/2005 | Lung | |

* cited by examiner

*Primary Examiner*—Wael Fahmy
*Assistant Examiner*—Minchul Yang
(74) *Attorney, Agent, or Firm*—Stout, Uxa, Buyan & Mullins, LLP

(57) ABSTRACT

A non-volatile memory cell is constructed from a chalcogenide alloy structure and an associated electrode side wall. The electrode is manufactured with a predetermined thickness and juxtaposed against a side wall of the chalcogenide alloy structure, wherein at least one of the side walls is substantially perpendicular to a planar surface of the substrate. The thickness of the electrode is used to control the size of the active region created within the chalcogenide alloy structure. Additional memory cells can be created along rows and columns to form a memory matrix. The individual memory cells are accessed through address lines and address circuitry created during the formation of the memory cells. A computer can thus read and write data to particular non-volatile memory cells within the memory matrix.

21 Claims, 7 Drawing Sheets

HIGH DENSITY CHALCOGENIDE MEMORY CELLS

CROSS-REFERENCE TO RELATED APPLICATIONS

This is a divisional application of application Ser. No. 10/456,818, filed on Jun. 6, 2003, now U.S. Pat. No. 7,067,865.

BACKGROUND OF THE INVENTION

1. Field of the Invention

The present invention relates generally to a memory cell structure for semiconductors, and more particularly, to chalcogenide memory cells.

2. Description of Related Art

Integrated circuits, typically in the form of microprocessors, microcontrollers, or other logic circuits, are used to control the functions of many modern electronic devices. For example, integrated circuits are used to control the functions of computers, telephones, and many other consumer electronics. It is generally necessary for the integrated circuits to retrieve (read) and store (write) data as they perform their functions. The data may be in the form of instructions for the integrated circuits (e.g., a program), data necessary for the execution of a program, or data generated during the execution of the program. It is highly advantageous to store the data in memory devices which are easily accessible by the integrated circuits.

Many different types of memory devices are known for the storage of data. In selecting a memory device, one should keep in mind the particular requirements for the data with which the memory device will be used. For example, the quantity of data and the required access time to the data can play an influential role in memory device selection. Regarding high-capacity memory devices, floppy disk drives, hard disk drives, compact disks (CDs) and digital video disks (DVDs) are commonly used to store large amounts of data and/or large programs. While facilitating dense storage of data/programs in a nonvolatile format, these memory devices require motors and other electro-mechanical devices to operate. Accordingly, relatively large amounts of electricity can be consumed and access time to the data can be attenuated.

Integrated circuits may also be used to form memory devices. Two common types of integrated circuit memory devices are random access memory (RAM) and read only memory (ROM). Many improvements and variations of RAMs and ROMs have been advanced to further their performance, a substantial percentage of which improvements are commercially available. Memory devices constructed of integrated circuits are relatively small, durable, and consume small amounts of electricity making them very adaptable and easy to use. In addition, integrated circuit memory devices typically have faster access, reading and writing times, compared to other types of memory devices.

However, conventional RAMs and ROMs have their own disadvantages. RAMs, while having fast data transfer rates and efficient writing architectures, must be continuously powered or their memory contents may be compromised. Thus, RAMs may loose their data, i.e. they are volatile, when power is inadvertently or accidentally removed. ROMs, while retaining their contents even in the absence of power, are limited in the number of times to which they may be written, the speed, and the manner in which they may be written. RAMs and ROMs, even with their limitations, find overwhelmingly practical applications in a majority of electronic devices. However, a need exists in the prior art for memory devices that can harness the advantages of integrated circuits while avoiding the disadvantages of RAMs and ROMs.

In an effort to create integrated circuit memory devices which are nonvolatile and which may be quickly and repeatedly written to, phase changing materials have been researched. Specifically, chalcogenide materials have been studied for their use as storage media for data. Chalcogenide materials generally comprise one or more of the elements Ni, Se, Te, Sb and Ge and are considered as being able to change phases, or states, while being incorporated into integrated circuits. Specifically, chalcogenide materials may be switched from a generally amorphous state to a generally crystalline state, or to an intermediate state there between, through the application of a switching current. Chalcogenide materials have greater resistances in the amorphous state than they have in the crystalline state. Thus, the resistance of the chalcogenide material may be set to represent or encode specific data to be stored. Once the data has been set in the form of a varying resistance level, resistances of the chalcogenide material may later be measured, without altering the data, in order to read the data that was stored.

Regarding the storage of binary code, chalcogenide materials may be configured to store either high or low resistive states, corresponding to logic "1" and logic "0" values, respectively. In addition, they may be used to store analog information by storing a resistive state along a spectrum of continuous resistive states. Chalcogenide materials are also fast and consume very little electrical current. Specifically, they are capable of being repeatedly switched between different resistive states within nanoseconds while consuming only picojoules of electrical energy. Another advantage of chalcogenide materials is that they are nonvolatile, being capable of retaining their resistive state for extended periods of time without the need for continuous power.

Methods of making and using chalcogenide materials to form chalcogenide memory cells are disclosed in U.S. Pat. No. 5,687,112 to Ovshinsky; U.S. Pat. No. 5,789,277 to Zahorik et al.; U.S. Pat. No. 5,837,564 to Sandhu et al.; U.S. Pat. No. 5,879,955 to Gonzalez et al.; U.S. Pat. No. 6,031,287 to Harshfield; U.S. Pat. No. 6,104,038 to Gonzalez et al.; U.S. Pat. No. 6,111,264 to Wolstenholme et al.; U.S. Pat. No. 6,147,395 to Gilgen; and U.S. Pat. No. 6,150,253 to Doan et al., all of which are hereby incorporated by reference in their entireties. As set fourth in the prior art, a typical chalcogenide memory cell will comprise a storage region which may be adjusted between an amorphous and a crystalline phase state. A current pulse, of only a few picojoules of energy having a current density between about $10^5$ and $10^7$ amperes per square centimeter, may be used to set the phase state of the storage region. This electrical current, which can become quite significant when millions or more memory cells are being used, may be reduced with the creation of smaller storage regions. In addition, smaller storage regions would allow for a greater density of memory cells to be created, thereby enhancing the commercial value of chalcogenide memory cells.

While advantages of smaller storage regions for chalcogenide memory cells are suspected, improved designs and manufacturing techniques are still needed to further reduce their size. The present invention is directed to overcoming, or at least reducing the affects of, one or more of the problems set forth above.

SUMMARY OF THE INVENTION

The present invention addresses the needs of the prior art by providing, in accordance with one or more aspects of the present invention, an improved memory cell structure and method for creating the memory cell structure. The different embodiments of the invention may include one or more of the following objectives, but may not necessarily include them all. One objective of the invention is to produce a non-volatile chalcogenide alloy memory cell having a very small data storage region. Another object is to produce a chalcogenide alloy memory cell where the storage region size is not limited by current photolithography resolution. Another object is to produce a chalcogenide alloy memory cell that can readily be produced using conventional integrated circuit processes. Another object is to produce a chalcogenide alloy memory cell wherein the thickness of an electrode can be used to control the contact area between the electrode and a chalcogenide alloy structure, and, accordingly, small pores are not required. Another object is to produce a chalcogenide alloy memory cell where program currents are injected into a side wall of a chalcogenide alloy structure. Another object is to produce a chalcogenide alloy memory cell with increased memory cell density. Another object is to produce a chalcogenide alloy memory cell with decreased power consumption requirements. Any feature or combination of features described herein are included within the scope of the present invention, provided that the features included in any such combination are not mutually inconsistent as will be apparent from the context, this specification, and the knowledge of one of ordinary skill in the art.

The present invention relates to a particular arrangement of materials used to produce a chalcogenide alloy memory cell and a method for manufacturing the memory cell. Millions of these chalcogenide alloy memory cells may be created in a memory matrix to achieve one or more of the stated objectives. Each memory cell has a chalcogenide alloy structure having a side wall juxtaposed against a side wall of an electrode. This design permits a storage region within the chalcogenide alloy structure to be created in the area juxtaposed against the electrode. One of the advantages of the invention is that conventional integrated circuit processing techniques allow for very tight and repeatable control in manufacturing very thin electrodes. The precision manufacturing process of the electrodes allows for the creation of uniform storage regions within each memory cell across the entire memory matrix.

In a preferred embodiment, the thickness of the electrode is specifically controlled using chemical mechanical polishing (CMP) or is controlled only as a function of the deposited thin film thickness. For example, an electrode may be deposited by chemical vapor deposition or other known deposition processes over an insulating layer and into an opening etched into the insulating layer. CMP may be used to remove material from the insulating layer and the electrode until the desired thickness of the electrode has been achieved. Optical or other metrology instruments may be used to verify the thickness either in-situ or after the completion of the CMP step.

The invention also describes a method for reading and writing to a particular memory cell within a memory matrix. Each memory cell is positioned above one of a plurality of address rows and below one of a plurality of address columns. The rows and columns are preferably perpendicular to one another and in their own horizontal planes. The memory cells are thus positioned between the planes containing the rows and columns and at the intersecting points of the rows and columns if the rows and columns were in the same plane. This allows each memory cell to be addressed by a unique combination of one address row and one address column. The address rows or columns may be formed, as is known in the art, by depositing conductive materials into trenches etched into an insulating layer.

A contact may be created for each memory cell to provide a connection between the address rows and the electrodes. The contact may be comprised of a diode, connected in series with the contact, to thereby facilitate electrical isolation the memory cells from one other. Electrically isolating the memory cells insures that during an operation on a particular memory cell, the data contained within the remaining memory cells will not be corrupted by the operation.

In another embodiment, a computer may be used to read and write data to particular memory cells within a memory matrix. The computer may, through the use of other integrated circuits and address rows and columns, connect a power source to a selected memory cell. The power source drives a current through the memory cell sufficient to set a desired physical state (crystalline, amorphous or somewhere therebetween) in the storage region of the chalcogenide alloy material. The state of the chalcogenide alloy material will remain constant without additional power consumption until another current is driven through the storage region. The computer can read the data in the memory cell by connecting an ohm meter (or other circuitry that can detect different resistance levels) to the memory cell and detecting the physical state of the chalcogenide material by its resistance. Other types of measurements, using other types of metrology instruments, may also be made on the chalcogenide material to detect different physical states of the chalcogenide alloy material.

Additional advantages and aspects of the present invention are apparent in the following detailed description and claims. It is to be understood that both the foregoing general description and the following detailed description are exemplary, and are intended to provide further explanation of the invention as claimed.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE PRESENTLY PREFERRED EMBODIMENTS

Figure 1:
FIG. 1 is a magnified cross-sectional view of a first dielectric layer that has been deposited over a wafer.
Figure 2:
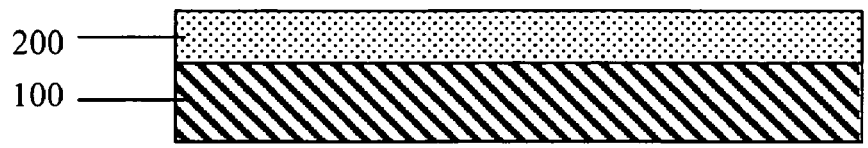
FIG. 2 is a magnified cross-sectional view of the wafer in FIG. 1 after a first conductive layer has been deposited in trenches formed in the first dielectric layer.

Reference will now be made in detail to the presently preferred embodiments of the invention, examples of which are illustrated in the accompanying drawings. Whenever possible, the same reference numbers are used in the drawings and the description to refer to the same or like parts. It should be noted that the drawings are in greatly simplified form and are not to precise scale. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner. In the following description, numerous specific details are set forth illustrating Applicant's best mode for practicing the invention and enabling one of ordinary skill in the art to make and use the invention. It will be understood, however, to one of ordinary skill in the art that the present invention may be practiced in certain applications without these specific details. Thus, the illustrated embodiments set forth herein are presented by way of example and not by way of limitation.

The intent of the following detailed description is to describe how to make and use the preferred embodiments, along with exemplary alternatives, of the invention. However, the scope of the invention is defined by the appended claims. Preferred embodiments for the chalcogenide alloy memory cells and methods for making the memory cells will now be described. In certain instances, well-known machines and process steps have not been illustrated or described in particular detail in order to avoid unnecessarily obscuring the present invention.

Figure 14:
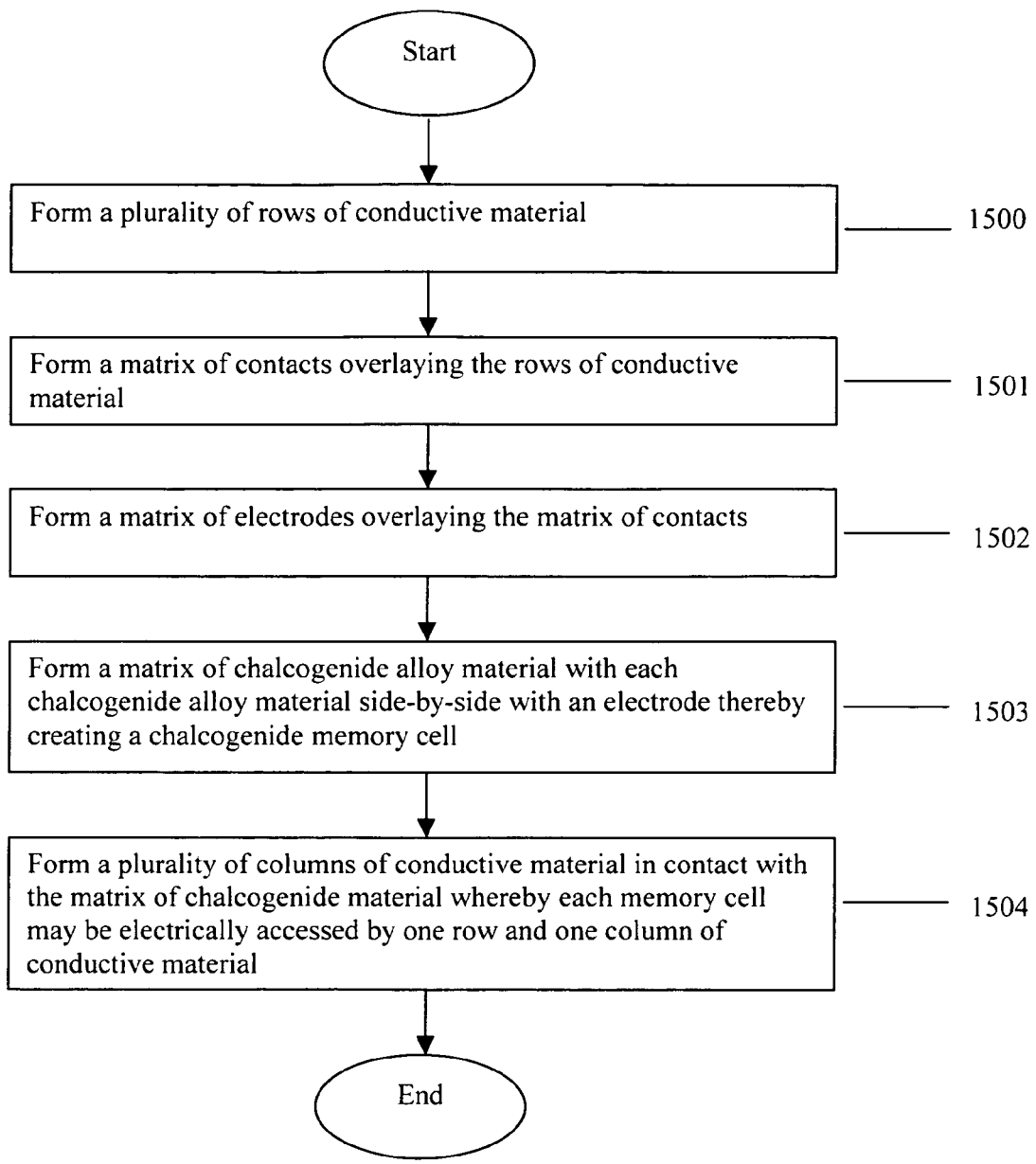
FIG. 14 is a flow chart of a method for producing a chalcogenide memory cell according to one embodiment of the present invention.

A flowchart illustrating a method for creating a matrix of chalcogenide memory cells according to the present invention is shown in FIG. 14. FIGS. 1-11 illustrate possible stages of a memory cell during the manufacturing process for the memory matrix. FIG. 1 illustrates a substrate 100 having a first deposited thin film of a dielectric material 101. Although the substrate 100 preferably comprises a silicon substrate, in alternative embodiments the substrate can comprise materials such as gallium nitride (GaN), gallium arsenide (GaAs), or other materials commonly recognized as suitable semiconductor materials to those skilled in the art. Initially, the substrate 100 is prepared prior to the dielectric layer 101 being formed using conventional deposition techniques, such as by sputtering, physical vapor deposition (PVD) or chemical vapor deposition (CVD). The dielectric layer 101 may comprise, for example, boron and phosphorous doped silicon glass (BPSG), silicon dioxide or silicon nitride.

A plurality of address rows comprising conductive material may be created in the first dielectric layer 101 using known semiconductor processing steps to complete step 1500. For example, a thin film of photoresist may be applied (e.g., spun) over the first dielectric material 101. A mask photolithography process may be used to harden (negative photoresist) or soften (positive) the photoresist, depending on the type of photoresist used, so that the photoresist adheres only over areas between designated trench locations. As an example, the wafer can be placed into a stepper (photolithography tool for patterning wafers) where it is aligned to a mask and exposed to ultra violet (UV) radiation. The mask may only be large enough to cover a small portion of the wafer, in which case the stepper steps the wafer through many quadrants, each of them being exposed in turn, until the entire or desired portion of wafer has been exposed to UV light. A cleaning step may be used implementing a chemical bath (developer) to dissolve the softened photoresist in areas designated for trenches while leaving hardened photoresist in areas between designated trenches, thereby yielding a patterned photoresist.

The patterned photoresist allows for the trenches to be etched into the exposed dielectric material 101 using conventional etching techniques. For example, by controlling the concentration and etch time, $CHF_3$ may be used to anisotropically etch portions of the dielectric material 101 not protected by photoresist to thereby form trenches. The above process may also be used to etch openings into dielectric layers as is known in the art. While a specific etching process has been described, other conventional etching processes may also be used for etching these trenches and for etching other later described trenches and openings during the manufacturing process of the present invention.

Figure 3:
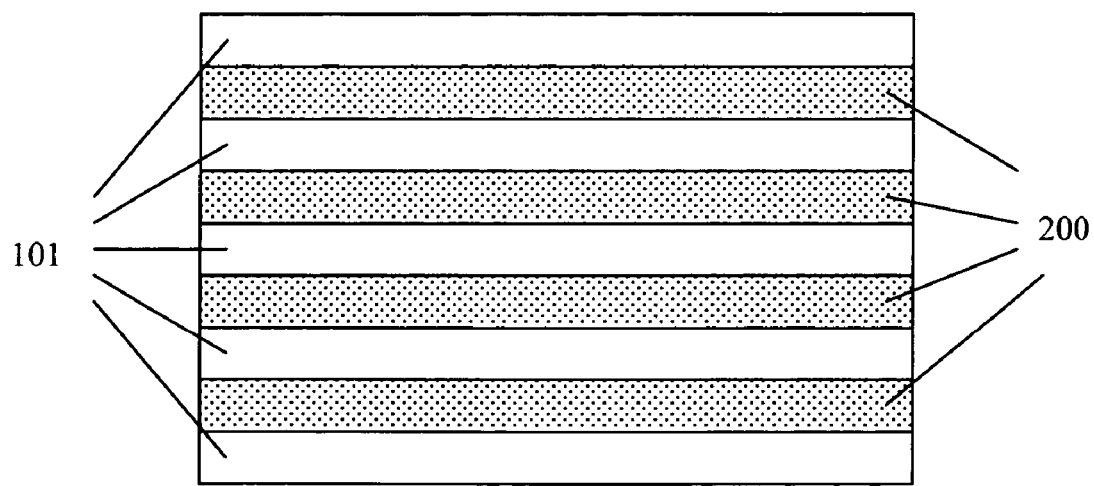
FIG. 3 is a magnified plan view of the wafer in FIG. 2 illustrating address rows separated by dielectric material.

A conductive material 200, such as carbon, aluminum, titanium, tungsten, or copper, along with combinations and alloys of these materials, such as aluminum copper, titanium nitride and titanium tungsten, can then be deposited over the dielectric layer 101 and into the trenches, using conventional means for depositing such materials such as PVD, CVD or sputtering. Chemical mechanical planarization (CMP) may be used to remove excess conductive material 200 deposited onto the first dielectric layer 101 thereby leaving the conductive material 200 only in the trenches as shown in FIG. 3. As is well-known to those having skill in the semiconductor processing art, CMP comprises an abrasive process performed on oxides and conductive materials for polishing the surfaces of the targeted objects. For example, chemical slurries can be used in combination with fine-grinding circular movements to reduce thicknesses of and planarize surfaces. The surfaces and thin structures which can be generated by CMP can have particular relevance in the context of the processing of, for example, the electrodes 700, as set forth below. In the instant application, CMP may be used to reduce the thickness of the dielectric layer 101 and conductive materials 200 so that the combined layer of material is at a predetermined thickness. The above-described preferred embodiment thus creates rows 200 for individually accessing each memory cell.

Alternative methods and materials may be substituted to simulate the function of the address rows 200. For example, a functional equivalent to the address rows 200 may be obtained by heavily doping N+ material into areas designated for the address rows 200 on a P-type substrate 100. Other known doping steps may also be implemented to improve the conductivity of the doped material in the address row areas.

Figure 4:
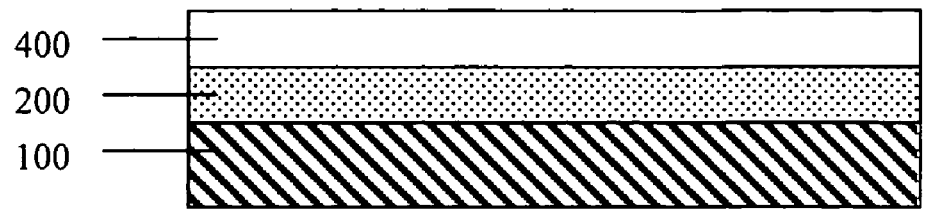
FIG. 4 is a magnified cross-sectional view of the wafer in FIG. 3 after a second dielectric layer has been deposited over the wafer.
Figure 5:
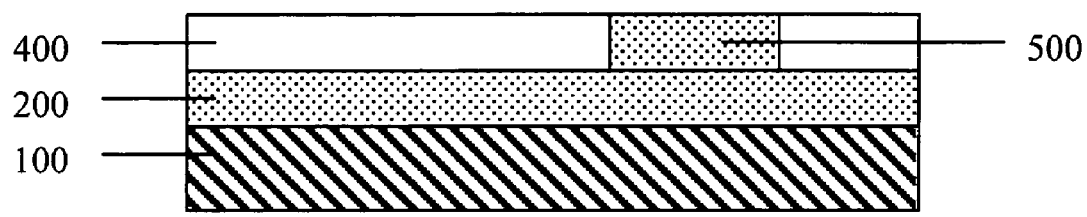
FIG. 5 is a magnified cross-sectional view of the wafer in FIG. 4 after a first opening has been etched into the second dielectric layer and a conductive material has been deposited into the first opening to form a contact.

A second dielectric thin film 400 may be deposited over the plurality of address rows 200 as illustrated in FIG. 4. The same materials and deposition techniques used to form the first dielectric layer 101 may also be used to form the second dielectric layer 400. A plurality of openings may be etched into the dielectric layer 400 using conventional etching techniques. The openings are positioned in rows and columns thereby forming a matrix pattern. The openings are also positioned over, and are etched deep enough to expose, the address rows 200. Contacts 500, as shown in FIG. 5, are created in the openings, as stated in step 1501, by depositing one or more layers, comprising one or more conductive materials, into the openings. For example, tungsten or polysilicon may be deposited into the openings using conventional deposition techniques. CMP may be used to remove excess conductive material from the second dielectric layer 400 and provide a flat planar top surface for the contacts 500.

In an alternative embodiment, each contact 500 comprises a diode. The diode electrically isolates its associated memory cell, the structure of which is set forth below, so that during an operation on one memory cell the remaining memory cells are electrically protected. This structure can prevent data contained in non-accessed memory cells from being accidentally corrupted during reading or writing to an accessed memory cell. Contacts 500 comprising diodes may be created, for example, by depositing a layer of P+ doped polysilicon followed by depositing a layer of N doped polysilicon into the openings as is well known to those skilled in the art.

Figure 6:
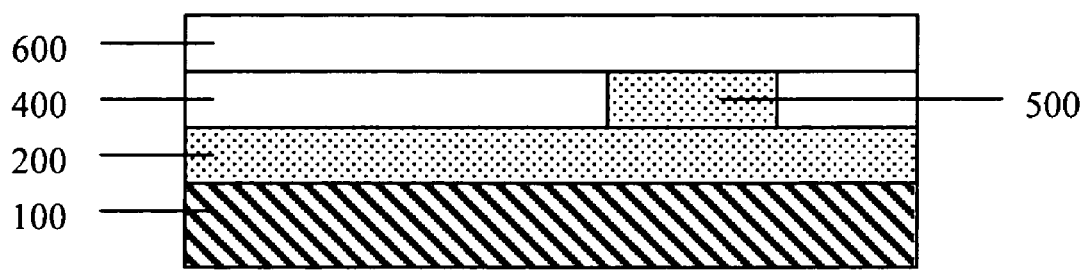
FIG. 6 is a magnified cross-sectional view of the wafer in FIG. 5 after a third dielectric layer has been deposited over the wafer.
Figure 7:
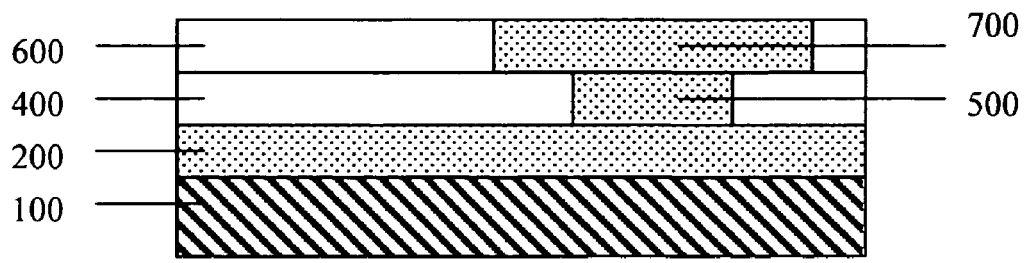
FIG. 7 is a magnified cross-sectional view of the wafer in FIG. 6 after a second opening has been etched into the third dielectric layer and a conductive material has been deposited into the second opening to form an electrode.

Referring now to FIGS. 6, 7 and 14, a plurality of electrodes is created with each electrode 700 formed overlaying a corresponding contact 500 as stated in step 1502. The first step in forming the electrodes 700 is to deposit a third dielectric layer 600 over the previously deposited second dielectric layer 400 and contacts 500. The same materials and deposition techniques used to form the first dielectric layer 100 can be used to form the third dielectric layer 600 for the resulting structure shown in FIG. 6. Openings may then be aligned and etched into the fourth dielectric layer 600 so that each opening exposes a top surface of a corresponding one of the contacts 500 as shown in FIG. 7. A conductive material can then be deposited over the fourth dielectric layer 600 to conform to and fill the openings. CMP may be used to remove excess conductive material on the fourth dielectric layer 600, thereby leaving the remaining conductive material only in the openings to form electrodes 700.

In accordance with a presently preferred embodiment, the electrodes 700 may be formed to a desired thickness by continuing the CMP process and removing material from the fourth dielectric layer 600 and the electrodes 700 until the desired thickness for the electrodes 700 is achieved. The electrodes 700 are preferably formed to have thicknesses ranging from about 10 to about 2000 Angstroms and, more preferably, are constructed to be about 500 Angstroms thick. The electrodes 700 are also preferably about 1000 Angstroms wide, but in alternative embodiments may have widths ranging from about 1000 to about 4000. The CMP process may thus be used for forming electrodes 700 into structures having very thin vertical side walls with very tight tolerances. The thickness of electrodes 700 is not only controlled by the CMP process, but also by the thickness of dielectric 600.

In accordance with an aspect of the present invention the thickness of the electrodes 700 can be an important factor in determining the contact areas of the electrodes 700 with the later-deposited chalcogenide alloy material. The contact area between each electrode 700 and the corresponding chalcogenide alloy material, also known as the pore size, determines the size of the storage region within the memory cell. Consequently, reducing the size of the contact areas can advantageously decrease power consumption, and increase manufacturing densities, switching-time speeds and sensitivities of the resulting chalcogenide alloy memory devices.

Figure 8:
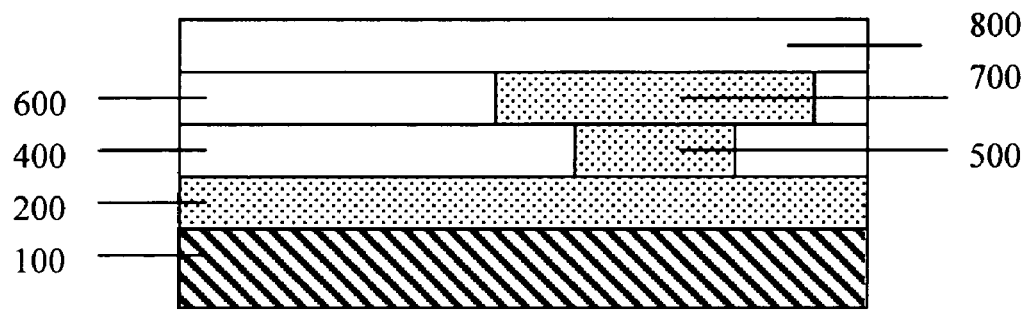
FIG. 8 is a magnified cross-sectional view of the wafer in FIG. 7 after a fourth dielectric layer has been deposited over the wafer.
Figure 9:
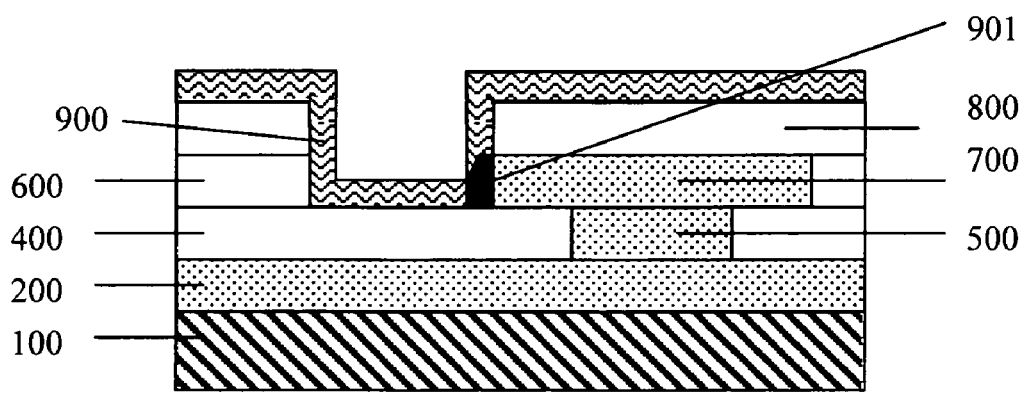
FIG. 9 is a magnified cross-sectional view of the wafer in FIG. 8 after a third opening has been etched into the fourth dielectric layer and a phase changing material has been deposited into the third opening to form a chalcogenide alloy structure.

Referring to FIGS. 8, 9 and 14, a process for fabricating a chalcogenide alloy structure 900 juxtaposed against an electrode 700 will now be described in association with step 1503. This fabrication is accomplished by depositing a fourth dielectric layer 800 over both the third dielectric layer 600 and the electrodes 700. The same materials and deposition techniques used to form the first dielectric layer 100 may also be used to form the fourth dielectric layer 800. As can be seen from FIG. 8, the fourth dielectric layer 800 serves to electrically isolate the electrodes 700 from one another and, furthermore, tends to provide structural support to the memory cell once its construction has been completed.

With particular reference to FIG. 9, a plurality of openings is then etched into the fourth dielectric layer 800 and partial electrodes 700, wherein each opening is positioned with an alignment and depth sufficient to expose a vertical side wall of a corresponding electrode 700, using conventional etching techniques. In a preferred embodiment, a portion of each vertical side walls extends into a corresponding opening. Each of the openings may be about 2000 to about 500 Angstroms wide. Chalcogenide alloy material 900 is then deposited over the fourth dielectric layer 800 and into the etched openings on the side wall. The chalcogenide alloy material 900 fills the openings, thereby establishing contacts with vertical side walls of the electrodes 700. The chalcogenide alloy material is preferably shaped to have a thickness ranging from about 10 to about 1000 Angstroms thick.

The chalcogenide alloy material 900 and a vertical side wall of each electrode 700 are thus manufactured juxtaposed against one another. The resulting contact area between the elements 700 and 900 forms a storage region 901 for each chalcogenide memory cell formed. The storage regions 901 may be made very small, since the side walls of the electrodes 700 produced by the inventive method may be made smaller than the resolution of current photolithography processes normally used to produce the contact areas for chalcogenide memory cells.

The chalcogenide alloy material 900 may comprise, for example, one or more of tellurium, antimony, germanium, selenium, bismuth, lead, strontium, arsenic, sulfur, silicon, phosphorous, nickel, and oxygen. Exemplary compositions for the chalcogenide alloy material 900 include average concentrations of Te in the amorphous state well below 70%, typically below about 60% and ranging in general from as low as about 23% up to about 56% Te and most preferably to about 48% to 56% Te. Concentrations of Ge are typically above about 15% and range from a low of about 17% to about 44% average in the high resistance state, remaining generally below 50% Ge, with the remainder of the principal constituent elements in this class being Sb. The percentages given are atomic percentages which total 100% of the atoms of the constituent elements. A preferred chalcogenide alloy material 900 uses a minimal amount of energy and rapidly switches between states. Chalcogenide alloys known in the art that use only picojoules to switch between states within nanoseconds, for example, may be implemented. Alloys that may be particularly advantageous include tellurium, antimony, and germanium having approximately 55 to 85 percent tellurium and 15 to 25 percent germanium, such as $Te_6Ge_{22}Sb_{22}$. Another may comprise $Ge_2Sb_2Te_5$ chalcogenide alloy. The particular alloy selected should be able to alter its state between an amorphous structure and a crystalline structure, or between various crystalline structures, wherein each structure has a different level of electrical resistance. The chalcogenide alloy may be advantageously selected based on its particular characteristics, including, among other things, energy requirements and time required for switching between states.

Figure 10:
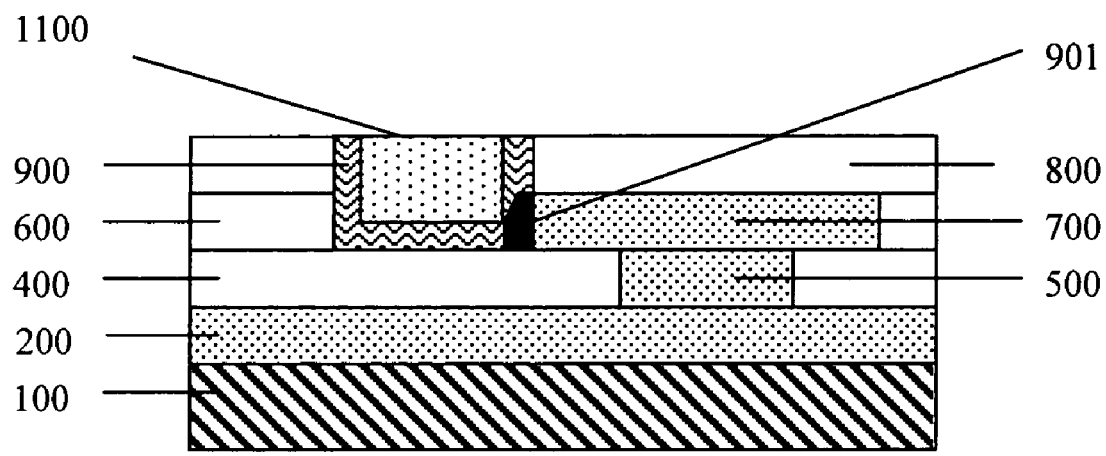
FIG. 10 is a magnified cross-sectional view of the wafer in FIG. 9 after a second conductive layer has been deposited.
Figure 11:
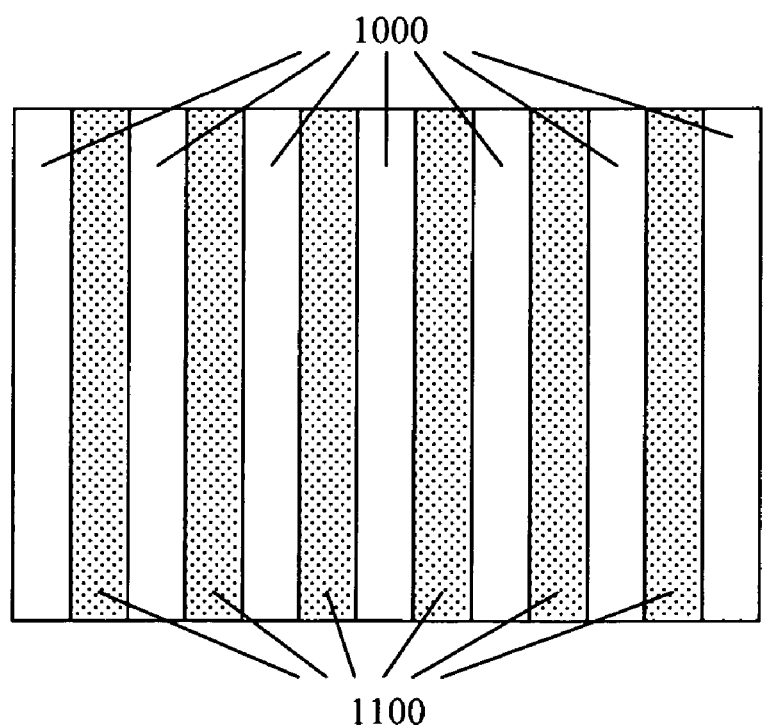
FIG. 11 is a magnified plan view of the wafer in FIG. 10 illustrating address columns separated by dielectric material.

Referring to FIGS. 10-11 and 14, a plurality of horizontal columns of conductive material, i.e. address columns 1100, can be created to complete step 1504. The address columns 1100 are preferably disposed above, on a horizontal plane with, and perpendicularly aligned with the earlier created address rows 200. The address columns 1100 and address rows 200 operate together to facilitate an individual selection of every memory cell based on a unique pairing of one address row 200 and one address column 1100.

A conductive material 1100 can then be deposited over the chalcogenide alloy material 900 and into the trenches. CMP may be used to remove excess conductive material 1100 and chalcogenide alloy material 900 above the dielectric layer 800, thereby leaving the conductive material 1100 in the trenches as shown in FIGS. 10 and 11. This process completes the formation of the address columns 1100. In one exemplary embodiment, the contact 500 can comprise polysilicon; the dielectric layers above the electrode 700 can comprise silicon dioxide, and the electrode above the chalcogenide memory cell can comprise an aluminum copper material. In another exemplary embodiment, the two electrodes contacting the chalcogenide memory cell can comprise carbon, and in still another embodiment these two electrodes can be formed into one or both of the address row 200 and address column 1100. In certain embodiments, the electrodes may comprise molybdenum and/or titanium nitride.

The memory matrix created by the described process includes a plurality of memory cells arranged in generally orthogonally arranged rows and columns. The memory cells in each row are coupled together by a respective address row 200, and the memory cells in each column are coupled together by a respective address column 1100. In the illustrated embodiment, each memory cell includes a contact 500 coupled to a respective address row 200, and each memory cell includes a chalcogenide alloy structure in electrical contact with an address column 1100. The address rows 200 and the address columns 1100 may collectively be referred to as address lines. The described structure allows each memory cell to be accessed based on a unique pairing of one address row 200 and one address column 1100. These address lines may be connected to periphery circuitry, as illustrated for example in FIG. 13, so that each of the memory cells can be accessed for the storage and retrieval of data.

Figure 12:
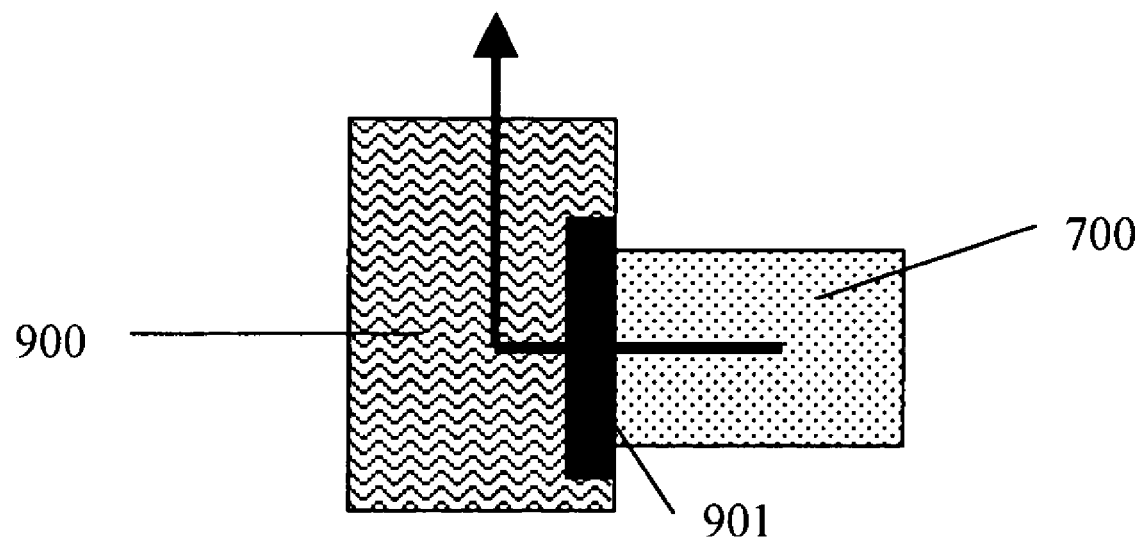
FIG. 12 is a magnified plan view illustrating the direction of a possible current flow direction of the present invention.

The plan view of FIG. 12 illustrates that the current flow through the storage area of the memory cell travels along a substantially horizontal plane, with some directional movement from a plane of the electrode 700 to a plane of the address column 1100 in the illustrated embodiment. This current flow path is made possible by passing the current from a side wall of the electrode 700 to a side wall of the chalcogenide alloy structure 900. The dimensions of the side walls for the electrodes 700 may be constructed very small and of a uniform thickness. The uniform thickness dimensions can improve the reliability of the memory cells, and the thin side walls can allow for low current and high density memory cells to be formed.

Figure 13:
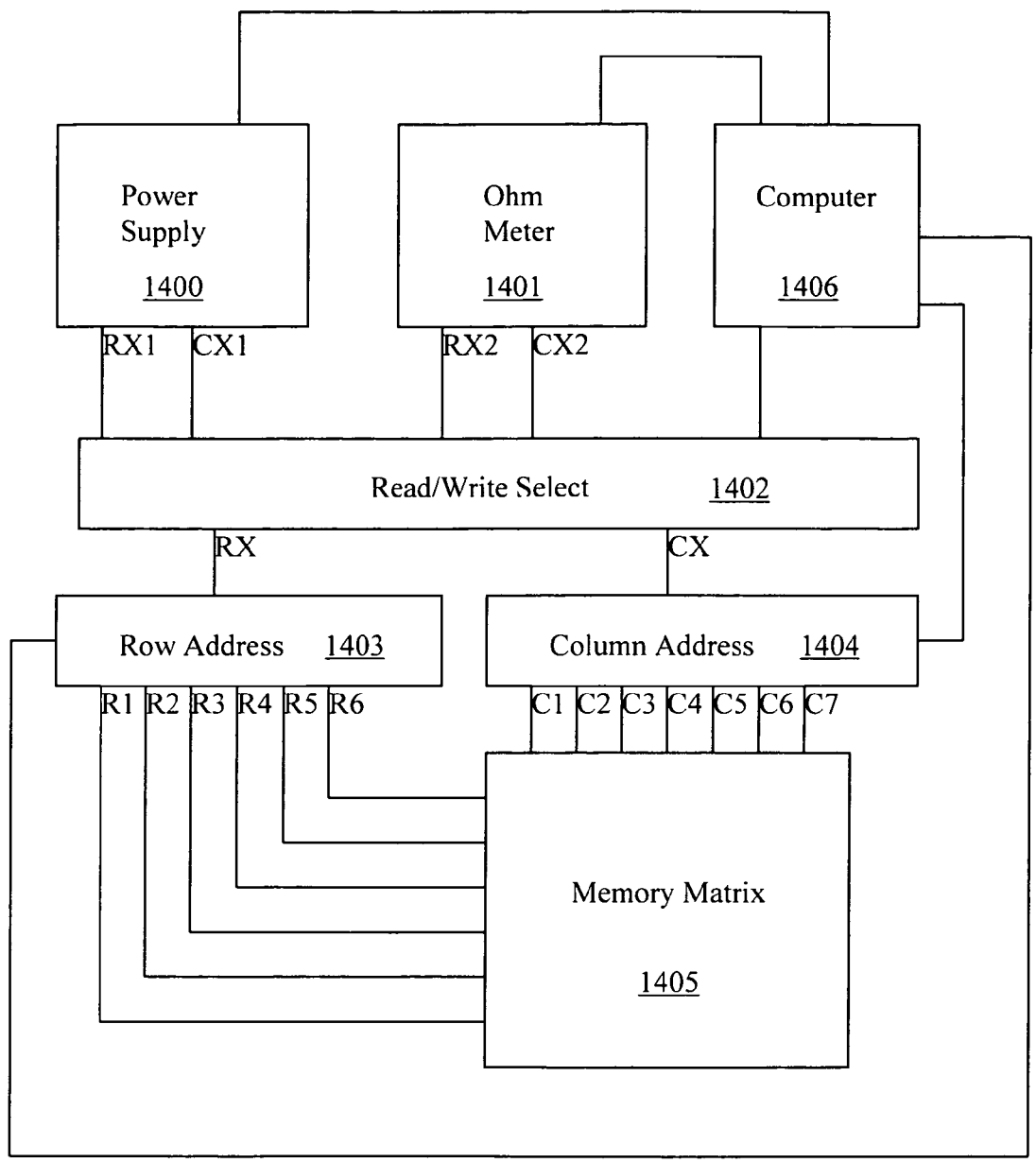
FIG. 13 is a functional block diagram of a system for reading and writing data to selected ones of the memory cells within a memory matrix.

FIG. 13 illustrates a simplified functional block diagram architecture in which a method of reading and writing data to a chalcogenide alloy memory cell matrix can be practiced according to one aspect of the invention. A memory matrix 1405 may be manufactured according to the previously described manufacturing process. While a specific method for producing the memory matrix 1405 has been provided, those skilled in the art will recognize that the same or functionally similar structures and arrangements may be created using various other integrated circuit manufacturing techniques. The memory matrix 1405 is shown with rows R1-R6 and columns C1-C7. Only six rows and seven columns are illustrated to simplify the drawing and the operation of the memory matrix 1405. The six rows and seven columns may be paired in 42 unique combinations allowing for 42 memory cells to be addressed in the memory matrix 1405 as shown. Commercial memory matrixes may comprise, for example, more than one million memory cells and, thus, may require more than one thousand rows and more than one thousand columns.

The row address 1403 circuit electrically connects the line RX to one, and only one, of the rows R1-R6 and the column address 1404 circuit electrically connects the line CX to one, and only one, of the columns C1-C7. The row address 1403 and column address 1404 circuits insure that only one memory cell in the memory matrix 1405 is addressed at a time. The row address 1403 and column address 1404 may comprise integrated circuits, such as one-to-many circuits, that are well known in the art. The row address 1403 and column address 1404, although illustrated in different boxes, are preferably integrated circuits manufactured on the same substrate with the memory matrix 1405.

A read/write select circuit 1402 determines whether lines RX1 and CX1, from a power supply 1400, or lines RX2 and CX2, from an ohm meter 1401, are connected to lines RX and CX. The read/write select circuit 1402 may also be an integrated circuit manufactured on the same substrate with the memory matrix 1405. Combining all the functions on one substrate can save manufacturing time and lower the cost of producing the product.

Connecting lines RX1 and CX1 to corresponding lines RX and CX connects the power supply 1400 to a single memory cell in the memory matrix 1405. The memory matrix 1405 does not require very much power so the power supply 1400 does not have to be very robust. The power supply 1400 may comprise a current source or other known means of supplying a very controlled, but small amount of current to a memory cell. Once connected to a memory cell via the read/write select 1402, row address 1403, and column address 1404, the power supply 1400 may then write data to a particular memory cell. For example, a relatively high or low current may be directed through the particular memory cell thereby changing the state of the chalcogenide alloy material to a crystalline or amorphous state respectively.

Connecting lines RX2 and CX2 to corresponding lines RX and CX connects the ohm meter 1401 to a single memory cell in the memory matrix 1405. The ohm meter may then read the resistance, and thus the data in the memory cell. For example, a relatively low or high resistance may indicate a corresponding crystalline or amorphous state. The state of the material, crystalline, amorphous or somewhere in between, may be used to represent binary or analog data. While an ohm meter 1401 has been illustrated in the diagram, those skilled in the art will recognize that other instruments or techniques may be used to detect the state of the chalcogenide material within each memory cell. In engineering such a circuit, it should be kept in mind that various parameters can be adjusted according to design parameters, including the electrode and chalcogenide dimensions and compositions, post deposition anneal processes, signal pulse duration, impurities such as oxygen present in the composition, crystallite size, and signal pulse waveform shape. As will be understood by those skilled in the art, these and other parameters can be adjusted to control, for example, the dynamic ranges of the resistances, the end-point resistances of the dynamic ranges, and the voltages required to set the chalcogenide alloy cells at such resistances.

A computer 1406 is preferably integrated into the system to allow the computer 1406 to read data from, or write data to, a specific memory cell in the memory matrix 1405. The computer 1406 may be connected to the power supply 1400 so that the computer 1406 can control the output of the power supply 1400 and thus control the data written to a memory cell in the memory matrix 1405. In an exemplary embodiment, a relatively low voltage, in the range of between 1 and 5 V, is required to program the chalcogenide material.

The computer 1406 may be connected to an ohm meter 1401, or circuits able to detect different resistive states, so that the computer 1406 can read the resistance and thus the data from a memory cell in the memory matrix 1405. Once the state of the chalcogenide material has been set by an appropriate programming voltage, the state does not change until another programming voltage is applied. Therefore, once the chalcogenide material has been programmed, a low voltage may be applied to the chalcogenide material to determine its resistance without changing its crystalline or amorphous state.

The computer 1406 may be connected to the read/write select 1402 to allow the computer 1406 to select between reading data from, or writing data to, a memory cell in the memory matrix 1405. The computer 1406 may also be connected to the row address 1403 and column address 1404 so the computer can select a specific row and a specific column, thereby selecting a specific memory cell to access. The computer 1406 thus has the capability to read from or write data to any memory cell in the memory matrix 1405.

It should be noted that while a system has been shown that reads and writes data to a single bit or memory cell at a time in a memory matrix, the shown system may be duplicated many times, preferably even on the same substrate. Such a megasystem would be able to read or write multiple bits of data at the same time equal to the number of times the system was duplicated, thereby greatly expanding the capabilities of the system.

In view of the foregoing, it will be understood by those skilled in the art that the methods of the present invention can facilitate formation of chalcogenide memory cells having improved characteristics in relation to those of the prior art. The above-described embodiments have been provided by way of example, and the present invention is not limited to these examples. Multiple variations and modification to the disclosed embodiments will occur, to the extent not mutually exclusive, to those skilled in the art upon consideration of the foregoing description. For example, while the electrical resistivity of chalcogenide alloy materials was discussed, the state of a state phase-changeable material may also be detected by measuring the electrical conductivity, optical transmissivity, optical absorption, optical refraction, optical reflectivity, or a combination of these properties. Furthermore, although described in the context of a memory cell matrix, the chalcogenide memory cells of the present invention are not limited to such configurations and applications. Other constructions and applications can be embodied, so long as the cells are constructed consistent with the recitations broadly set forth in the following claims. Such variations and modifications, however, fall well within the scope of the present invention as set forth in the following claims.

I claim:

1. A method of fabricating a phase-changeable memory cell, comprising:

providing a semiconductor substrate having a substantially planar surface;

forming at least one electrode in a dielectric layer with a side wall that is not parallel to one or more of the substantially planar surface and a surface of the at least one electrode;

forming at least one chalcogenide alloy structure in an opening of the dielectric layer by covering a bottom and sidewall of the opening with chalcogenide alloy material to define a recess within the opening, such that the recess being enclosed by the chalcogenide alloy material at a bottom and sidewall of the recess, wherein upon formation of both the at least one electrode and the at least one chalcogenide alloy structure the side wall of the electrode is electrically coupled to the at least one chalcogenide alloy structure; and refilling the recess with conductive material to form a conductive address.

2. The method as set forth in claim 1, wherein a plurality of sidewalls of the at least one chalcogenide alloy structure and the at least one electrode are perpendicular to the substantially planar surface.

3. The method as set forth in claim 1, wherein the at least one sidewall is substantially perpendicular to a plane formed by a plurality of address rows and address columns of the semiconductor substrate.

4. The method as set forth in claim 3, wherein the step of forming the at least one electrode comprises a step of depositing the at least one electrode followed by a step of reducing a thicknesses of the at least one electrode using a chemical-mechanical polishing (CMP) process.

5. The method as set forth in claim 1, wherein: the at least one electrode comprises a plurality of electrodes; and the at least one chalcogenide alloy structure comprises a plurality of chalcogenide alloy structures.

6. The method as set forth in claim 1, wherein the at least one electrode is formed to have a film thickness of between about 10 and about 2000 Angstroms.

7. The method as set forth in claim 1, wherein at least a portion of the side wall of the at least one electrode is disposed within the at least one chalcogenide alloy structure.

8. The method as set forth in claim 1, and further comprising forming at least one address row, a diode disposed between the at least one electrode and the at least one address row, at least one contact connecting the at least one address row to the at least one electrode, and at least one address column connected to the at least one chalcogenide alloy structure, the at least one address row and the at least one address column being disposed perpendicularly to one another on different horizontal planes.

9. The method as set forth in claim 1, and further comprising forming a plurality of conductive address rows within etched dielectric trenches, at least one contact connecting at least one of the address rows to the at least one electrode, and a plurality of conductive address columns formed within etched dielectric trenches and connected to the at least one chalcogenide alloy structure, the address rows and address columns being disposed perpendicularly to one another in non-intersecting horizontal planes.

10. A method of fabricating a phase-changeable memory cell, comprising:

forming at least one electrode above a semiconductor substrate, the at least one electrode having a substantially planar surface and a side wall, which is not parallel with the planar surface;

forming at least one chalcogenide alloy structure after formation of the at least one electrode, wherein the chalcogenide alloy structure is formed in an opening of the dielectric layer by covering a bottom and sidewall of the opening with chalcogenide alloy material to define a recess within the opening, such that the recess is enclosed by the chalcogenide alloy material at a bottom and sidewall of the recess, wherein upon formation of both the at least one electrode and the at least one chalcogenide alloy structure the side wall of the electrode is electrically coupled to the at least one chalcogenide alloy structure; and refilling the recess with conductive material to form a conductive address.

11. The method as set forth in claim 10, wherein the at least one electrode is formed to have a sidewall that is substantially perpendicular to the substantially planar surface.

12. The method as set forth in claim 11, wherein a plurality of sidewalls of the at least one chalcogenide alloy structure and the at least one electrode are perpendicular to the substantially planar surface.

13. The method as set forth in claim 10, wherein the at least one sidewall is substantially perpendicular to a plane formed by a plurality of address rows and address columns of the semiconductor substrate.

14. The method as set forth in claim 13, wherein the step of forming the at least one electrode comprises a step of depositing the at least one electrode followed by a step of reducing a thicknesses of the at least one electrode using a chemical-mechanical polishing (CMP) process.

15. The method as set forth in claim 10, wherein the at least one electrode comprises a plurality of electrodes.

16. The method as set forth in claim 10, wherein the at least one chalcogenide alloy structure comprises a plurality of chalcogenide alloy structures.

17. A method of fabricating a memory matrix of phase-changeable memory cells, comprising:

forming a plurality of address rows on a semiconductor substrate;

forming electrodes in a dielectric layer above the address rows, each of the electrodes having a substantially planar surface and a side wall, which is not parallel with the planar surface;

forming chalcogenide alloy structures above the dielectric layer, wherein the chalcogenide alloy structure is formed in an opening of the dielectric layer by covering a bottom and sidewall of the opening with chalcogenide alloy material to define a recess within the opening, such that the recess is enclosed by the chalcogenide alloy material at a bottom and sidewall of the recess, wherein upon formation of both the electrodes and the chalcogenide alloy structures the side walls of the electrodes are electrically coupled to the structures; and coupling the chalcogenide alloy structures to a plurality of address columns that are formed by refilling the recess with conductive material.

18. The method as set forth in claim 17, wherein the step of forming electrodes is performed before the step of forming the chalcogenide alloy structures.

19. The method as set forth in claim 17, wherein: each sidewall of the electrode is substantially perpendicular to a plane formed by the address rows and the address columns; and the chalcogenide alloy structures are disposed in juxtaposition with the side walls.

20. The method as set forth in claim 19, wherein the step of forming the electrodes comprises a step of depositing the electrodes followed by a step of reducing a thicknesses of the electrodes using a chemical-mechanical polishing (CMP) process.

21. A method of fabricating a phase-changeable memory cell, comprising:

providing a semiconductor substrate;

forming a first dielectric layer on the semiconductor substrate;

removing a portion of the first dielectric layer;

filling the removed portion of the first dielectric layer with a first conductive material to form an address row;

forming a second dielectric layer on the first dielectric layer and the address row;

removing a portion of the second dielectric layer;

filling the removed portion of the second dielectric layer with a second conductive material to form a contact;

forming a third dielectric layer on the second dielectric layer and the contact;

removing a portion of the third dielectric layer;

filling the removed portion of the third dielectric layer with a third conductive material to form an electrode;

forming a fourth dielectric layer on the third dielectric layer and the electrode;

removing portions of the third dielectric layer and the fourth dielectric layer to generate an opening in the third dielectric layer and the fourth dielectric layer;

depositing chalcogenide alloy material on a bottom and sidewall of the opening to define a chalcogenide alloy structure having a recess within the opening, such that the recess is enclosed by the chalcogenide alloy material at a bottom and sidewall of the recess, wherein a sidewall of the electrode is coupled to an outer sidewall of the chalcogenide alloy structure; and refilling the recess with conductive material to form an address column.

* * * * *